United States Patent [19]

Conway et al.

[11] 4,331,830
[45] May 25, 1982

[54] HOUSING FOR ELECTRICAL COMPONENTS

[75] Inventors: Harry E. Conway, Baltimore; John W. Hughes, Columbia, both of Md.

[73] Assignee: Westinghouse Electric Corp., Pittsburgh, Pa.

[21] Appl. No.: 188,639

[22] Filed: Sep. 19, 1980

[51] Int. Cl.³ .............................................. H05K 7/20
[52] U.S. Cl. ........................ 174/16 R; 174/12 R; 361/385; 361/383
[58] Field of Search ............. 174/12 R, 17 R, 17 G, 174/17 F, 17 LF, 15 R, 16 R; 361/392, 395, 380–386, 389

[56] References Cited
U.S. PATENT DOCUMENTS 4,276,530 6/1981 Benke ............................ 174/15 R

OTHER PUBLICATIONS

Temp.-Controlled Immersed Cooling System, Councill et al., IBM Tech. Discl. Bull., vol. 11, No. 9, Feb. 1969, p. 1097.
Integrated Module Heat Exchanger, Antonetti et al., IBM Tech. Discl. Bull., vol. 20, No. 11A, Apr. 1978, p. 4498.

Primary Examiner—Gerald P. Tolin
Attorney, Agent, or Firm—H. W. Patterson

[57] ABSTRACT

A heat dissipating container for electrical components immersed in a liquid dielectric in one chamber and for electrical components surrounded by an air dielectric in another chamber. A flexible bladder serves as a common wall with the liquid dielectric chamber and an air filled recess that is in communication with the air filled chamber to compensate for expansion and contraction of the liquid.

12 Claims, 6 Drawing Figures

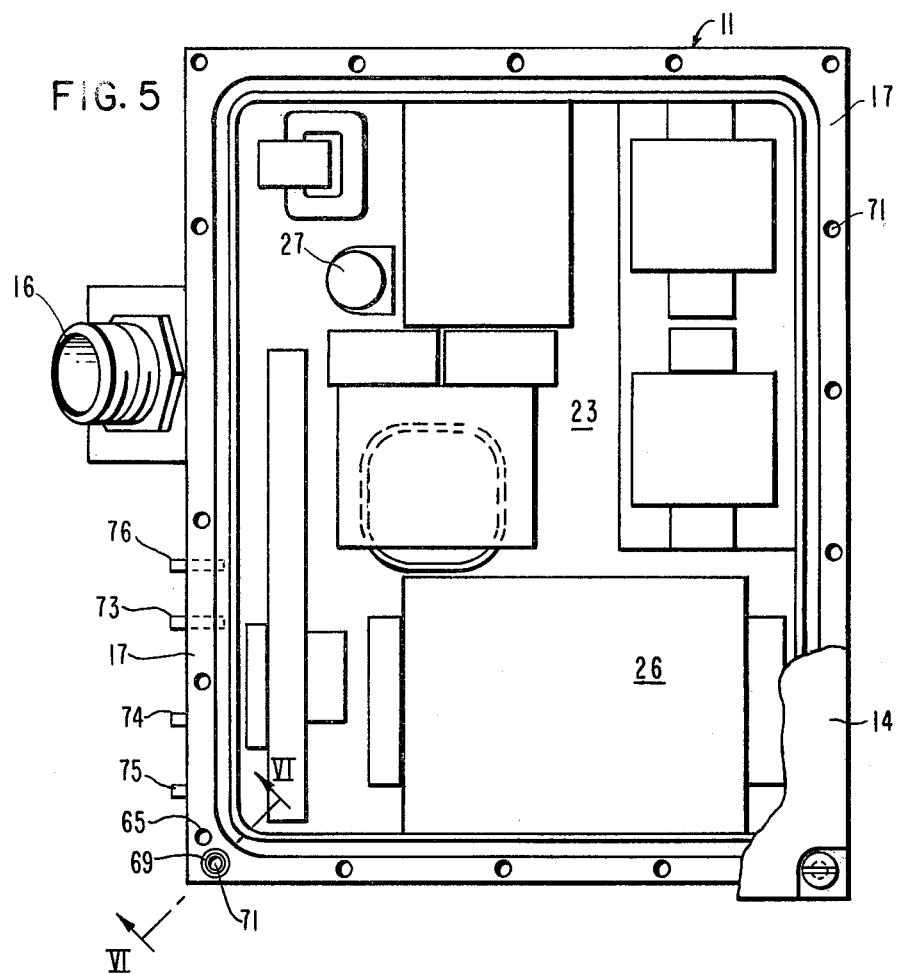
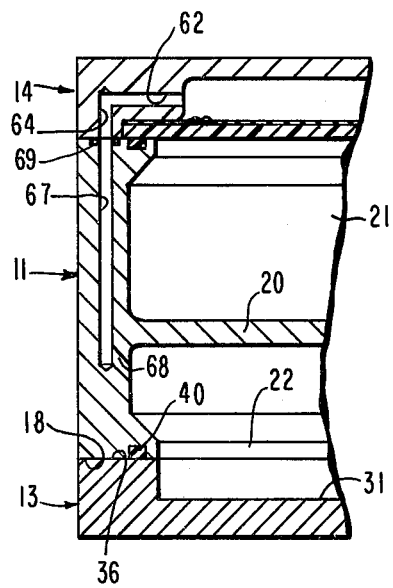

HOUSING FOR ELECTRICAL COMPONENTS

The Government has rights in this invention pursuant to Contract No. F33657-72-C-1002 awarded by the Department of the Air Force.

BACKGROUND OF THE INVENTION

In the packaging of heat generating electrical components, such as high voltage power supplies, and low voltage power supplies, for example, housings or containers for such components are required that provide the proper dissipation of heat as well as permitting ease of maintenance with respect to the components mounted therein. The problems connected with such heat dissipation, when used in airborne radar type systems, for example, are greatly increased where such housings are subjected to wide excursions of ambient temperature, high levels of vibration, and have limited space requirements.

It is well known that components which generate a moderate amount of heat may be mounted in a metallic container that is surrounded by a gaseous dielectric, such as air, with the heat being transferred to the surrounding air and conducted by the metallic container. For components that generate a much greater degree of heat, a liquid dielectric is necessary for conducting the heat from the components through the metallic housing.

However, when a liquid dielectric coolant is required, volume must be allowed for thermal expansion of the liquid in the container. To partially fill such a housing or container to provide space for the liquid to expand, permits voids in the coolant thereby creating hot spots or electrical breakdown. Heretofore, it has been proposed to provide a housing or container with a voidfree liquid coolant that utilizes a spring loaded bellows connected to the liquid container. The expanding liquid in the container fills the bellows, against the force of the spring, and when the liquid contracts in volume, the spring forces the liquid back into the container. Such an arrangement, although functionally satisfactory for many applications, requires extra space in order to accommodate the external bellows structure. Another solution proposed a housing with a flat flexible bladder forming a portion of the chamber that houses the components, and a pressurized gas, usually air was applied to the opposite surface of the bladder. The pressurized air was usually supplied by the aircraft at a constant pressure, which required external and relatively complicated apparatus, that also tended to frustrate the space limitations.

Thus, it is desirable to provide a heat dissipating container with heat generating components surrounded by a liquid dielectric that is compact and does not require an external structure or apparatus to compensate for the thermal expansion and contraction of the liquid coolant.

SUMMARY OF THE INVENTION

In accordance with the present invention, a metallic container is provided that has at least two compartments or chambers that are isolated from each other. A flexible bladder is mounted such that one side forms a wall of one of the chambers. The other chamber is connected by a passageway or orifice to a small recess or chamber formed by a portion of the container and the other side of the flexible bladder. The chamber formed by the container and the one side of the bladder is filled with a liquid dielectric, while the other chamber contains a gas that is slightly above atmospheric pressure at room temperature. The liquid dielectric expands and contracts in the one chamber while increasing and decreasing the gas pressure in the other chamber.

BRIEF DESCRIPTION OF THE DRAWINGS

FIG. 5 is a plan view of the container of FIG. 1 with the cover assembly removed to illustrate a typical placement of components in the upper chamber therein; and FIG. 6 is a fragmentary view taken on lines VI—VI of FIG. 5 with the cover assembly of FIG. 4 mounted thereon in sealing relationship.

DESCRIPTION OF THE PREFERRED EMBODIMENT

Figure 1:
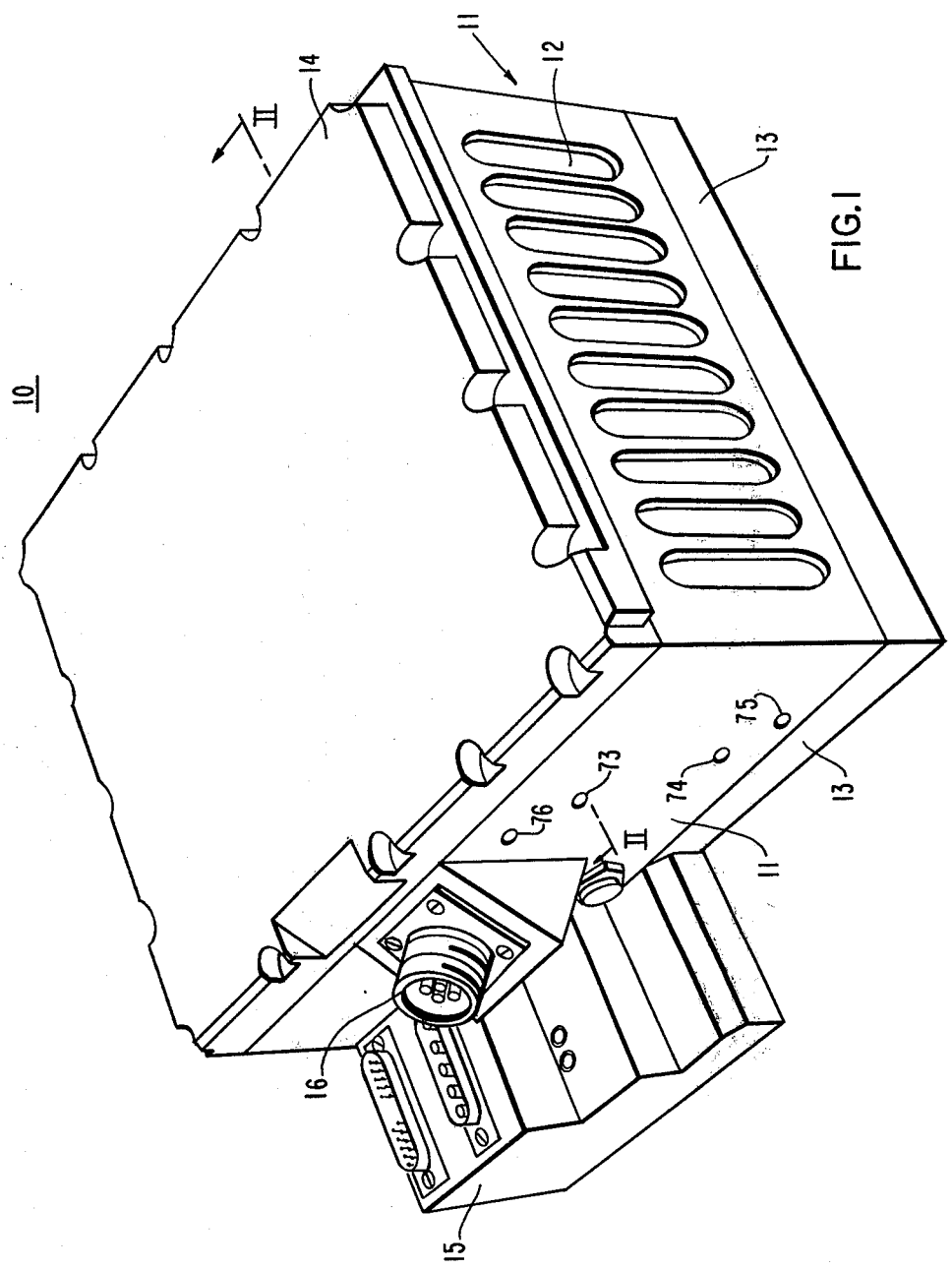
FIG. 1 is a three dimensional view of a container constructed in accordance with one embodiment of the present invention.
Figure 2:
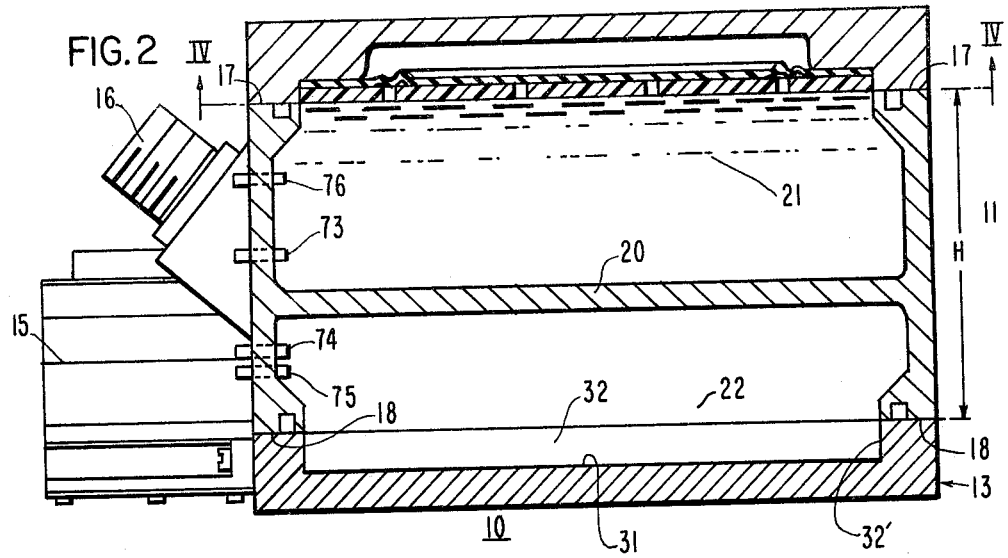
FIG. 2 is a sectional view taken on line II—II of FIG. 1 and looking in the direction of the arrows.

Referring to FIG. 1, a housing or container assembly in accordance with the present invention, generally referred to as 10, is a box-like structure that is generally rectangular in configuration, and is preferably made of aluminum for good heat dissipating qualities. The housing 10 has a frame-like member 11 that forms the side walls of both chambers. The frame 11 may have a plurality of recesses such as 12 for improving the heat dissipation of the housing. A base plate member 13 is fastened to a lower flange portion of the frame 11 to form the bottom of the container 10. A cover assembly 14 fits on the upper flanged surface of the frame 11 to enclose the top, thereby providing a sealed generally rectangular compact housing for heat generating electrical components. The assembly 14, the base plate 13, and the frame 11 constitute the shell of the container. An electrical connector 15 may be attached to the base plate 13 of the container 10 for electrically connecting components in one of the chambers and the connector 16 is attached to the wall 11 for the external electrical connection of electrical components within another chamber of the housing 10.

Referring to FIGS. 2 through 5, the frame 11 is a single piece of aluminum of a predetermined height h, (FIG. 2), which may be referred to for convenience as the axial dimension. The frame 11 has an upper plane edge surface 17 that forms a continuous peripheral flange that is generally rectangular in configuration as shown in FIG. 5. The frame 11 has a lower flange surface 18 that is substantially parallel to the upper flange surface 17. The frame 11 has an integrally formed isolation plate 20 that segregates the frame 11 into an upper chamber 21 and a lower chamber 22. The isolation plate 20 which is common to the upper and lower chambers has an upper surface 23 that includes means such as blind threaded openings 24, for example, for inserting screws 25 to attach electronic or electrical components such as 26 and 27 mounted in the upper chamber 21.

The base plate 13 is preferably a single piece of aluminum that has a plane bottom surface 30 that forms the bottom exterior portion of the enclosure 10 and an internal plane surface 31 that forms the bottom portion of a recess 32 that is bounded by surfaces 32' for supporting components such as 33 and 34. Conventional means are provided, such as blind threaded openings, for example, to securely fasten the components, such as 33 and 34, to the surface 31 for good heat dissipation. An integrally formed upwardly extending projection 35 may be provided to space individual components on the internal surface 31 and provide additional heat dissipation surfaces. The base plate member 13 also has a peripheral flange surface 36 that extends normal to the axial plane that mates with the opposing flange surface 18 of the side wall member 11. The base plate member 13 is fastened to the lower flange of the frame or wall member 11 by screws 37 that extend through openings 38 into threaded portions 39 thereof. A sealing ring 40 fits in a continuous groove 41 in the flange 18 to provide a pressure seal with the flange 36. Various projections and indentations such as 42 and 43 may be integrally formed with the plate 20 to provide a close fit around the specific components 33 and 34 in the lower chamber 22 for the better conduction and dissipation of heat from such components.

The cover assembly 14 includes an aluminum top member 44 having an area and configuration to completely enclose the chamber 21. The top 44 has an upper plane surface 45 and a lower central surface 46 to provide a recess 47 that extends outwardly to terminate at a flange surface 48 that mates with the flange 17 of the side wall 11. The flange 48 at its inner edge has a slight recess that is bounded by side walls 49 into which fits a bladder member 50, which is protected by a guard member 51 that also fits into the recess bounded by the walls 49 and is of sufficient thickness to be flush with the flange 48. The bladder member 50 may be any flexible rubber-like material that preferably includes ridges 52 to provide ease of flexure when a pressure differential occurs on either its upper surface 53 or its lower surface 54. The guard member 51 has a plurality of openings 55 therethrough and may be constructed of any rigid plastic material to prevent pressure on the upper surface 53 of the bladder 50 from forcing the bladder against the electronic components 26 and 27, for example, decreasing the volume of the upper chamber 21 below a predetermined minimum. The bladder 50 and the guard member 51 are securely attached to the underside of the top cover 44 in the recess bounded by the side walls 49 by screws 56 that thread into bores 57. A sealing ring such as 60 fits in a continuous groove 61 in the flange surface 17 of the frame 11 so that when the flanges 48 and 17 are in a mating relationship, the chamber 21 is sealed.

Figure 4:
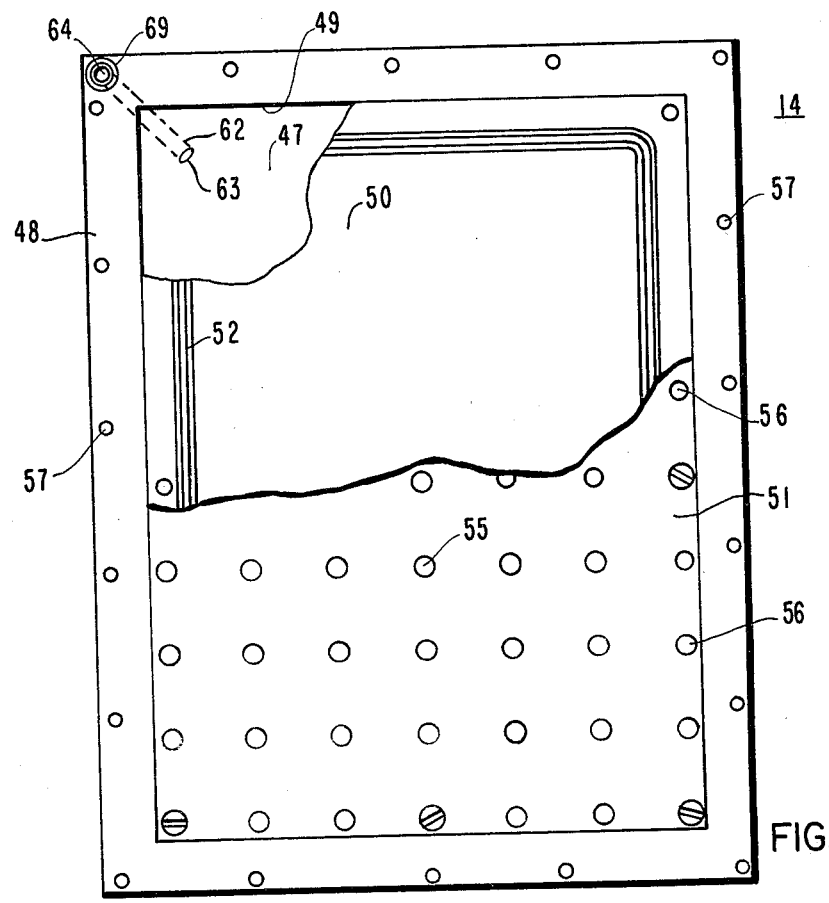
FIG. 4 is a plan view that is partially cut away to illustrate the cover assembly from the interior of the container of FIG. 1.

FIG. 4, which shows a partial cut-away view of the cover assembly 14, reveals an elongated opening or orifice 62 that is formed in the metallic top cover member 44 that communicates at its inner end 63 with the recess 47, and at its opposite end 64 with the flange surface 48. As shown in FIG. 6, the end 64 of the orifice 62 mates with an upper end 65 (see FIG. 6) of an opening 67 that communicates with the lower chamber 22 at its open end 68. An O-ring seal surrounds the end 64 of the orifice 62 to prevent the escape of air from the orifice 62 when assembled. Thus, when fully assembled, the recess 47 of the cover assembly 14 communicates via the opening 62 and 67 with the lower chamber 22.

Figure 3:
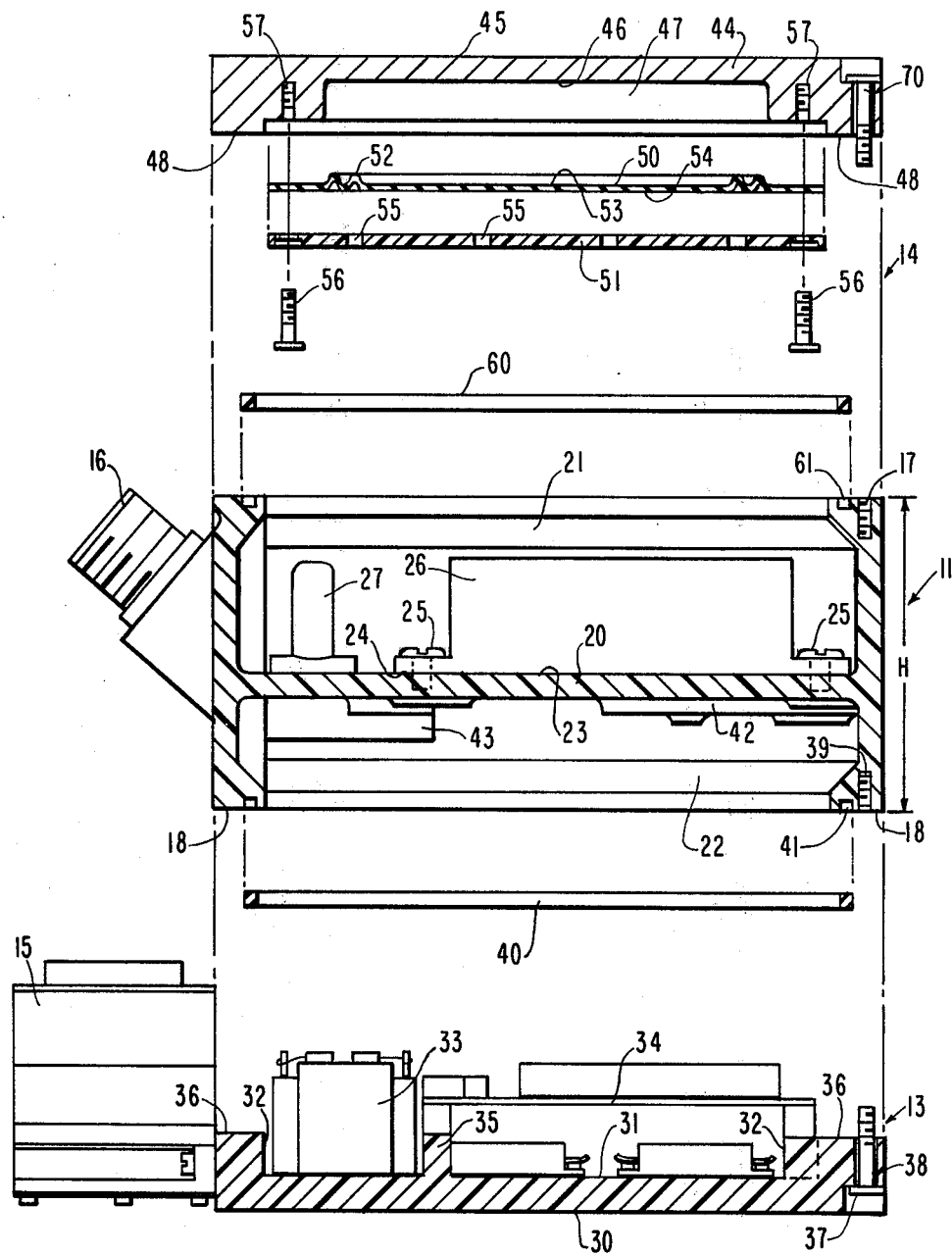
FIG. 3 is an exploded sectional view similar to FIG. 2 to illustrate the manner in which the various portions of the container are assembled, and also illustrate a typical mounting of electrical components therein.

In assembling the housing 10 of FIG. 1, the electrical components such as 33 and 34 are mounted on the surface 31 in the inner recess of the base plate member 13 as shown in FIG. 3, and the components such as 26 and 27 are mounted on the surface 23 of the isolation plate 20. The connector 16 is suitably connected to the various mounted components and where the wires feed through (not shown) the member 13, they are hermetically sealed in any conventional manner. Also, the components such as 33 and 34 on the base plate member 13 are suitably connected to the connector 15. Where the wires feed through (not shown) the member 13, they are hermetically sealed in any conventional manner. The base plate 13 is then positioned such that its flange surface 36 mates with the opposing flange surface 18 of the frame member 11 and is suitably fastened to provide the sealed chamber 22 and the bottom of the container. The cover assembly 14 is then positioned to cover the chamber 21 and is suitably fastened by screws 70 that fit into openings 71 (see FIG. 5) to seal the chamber 21, it being noted that one wall surface of the sealed chamber 21 includes one surface of flexible bladder 50 with the other walls being surface 23 of plate 20 and internal surfaces of the frame 11. A measured amount of liquid coolant, such as any of the well known fluorocarbons, for example, may be introduced through a valve 73 such as shown in FIG. 5. In introducing the liquid, the air is preferably first evacuated through the valve 73, and then a precise measured amount of fluid is introduced into the chamber 21 to completely fill the vacuum in the chamber 21. The ground member 51 keeps the bladder 50 from being driven in contact with the components during evacuation. Air is introduced into the lower chamber 22 and into the recess 47 so as to be slightly higher than atmospheric pressure by way of a conventional valve 74. A relief valve such as 75 in the frame 11, which is in communication with the chamber 22, releases any excessive air pressure in the chamber 22 and the domed recess 47 under extreme conditions. A relief valve such as 76 in the frame 11, which is in communication with the chamber 21, serves to release excessive liquid pressure in the chamber 21.

In one practical application of the present invention, the upper chamber 21 contained high voltage power supply components represented by components 26 and 27 for a radar-type system while the lower chamber 22 contained the lower voltage supply components represented by 33 and 34 for such system. Within the high voltage upper chamber 21, the bladder 50 compensates for the changing liquid volume. When the liquid expands, the bladder forces air from the recess 47 through the elongated opening or orifice 67 to the low voltage chamber 22, and combines with the air already in the chamber 22, thus raising the pressure such as to 15 lbs. gauge pressure, for example. The air in the low voltage chamber 22 maintains a pressure on the bladder/liquid combination regardless of altitude of the airborne system. With the container of the present invention, liquid expansion or contraction is compensated for within the power supply, thus eliminating the need for an external liquid expansion compensator. The liquid dielectric is contained within the high voltage chamber 21 so that no components are uncovered at any altitude or position of the power supply during flight. In summary, the high voltage chamber 21 is one piece with the sealed top cover assembly 14. The low voltage chamber 22 is formed by the unit base plate member 13 and seals against the frame or side wall member which is common to the high voltage chamber 22. Only two seals 40 and 60 are utilized for the entire assembly, minimizing possible leakage.

For maintenance, it is only necessary to remove the top cover assembly 14, pour out the liquid, repair and replace the cover assembly, and refill with liquid. Maintenance of the low voltage components in the chamber 22 is also easily accomplished by merely removing the base plate member 13 without disturbing the liquid. It is noted that the low voltage components such as 33 and 34 and the high voltage components such as 26 and 27 are separated into two subassemblies so that such components may be manufactured and tested separately, each with special attention required for the particular unit. The higher heat dissipation in the low voltage chamber 22 is permitted in that it is mounted directly on the container base plate heat sink. The high voltage components in the chamber 21 are mounted above the low voltage section on an isolation plate that includes the frame or side wall member for efficient heat dissipation.

Although the invention has been described in connection with one specific preferred embodiment, it is understood that various modifications may be made in accordance with the particular components utilized and the application intended without departing from the spirit or scope of the present invention.

We claim:

1. A heat dissipating container for electrical components, comprising a metallic shell having a pair of chambers therein, one of said chambers for holding a liquid dielectric and another chamber for holding a gaseous dielectric, a flexible bladder member mounted in the container and positioned such that one surface of the bladder forms at least a portion of one of the walls of the liquid dielectric chamber and having a portion of the bladder spaced from the metallic shell to form a recess that is sealed from the liquid dielectric chamber, and means to direct the flow of gas between the recess and the gas dielectric chamber.

2. A container according to claim 1 wherein the metallic shell includes an internally positioned metallic plate that is common to both of the chambers, with means for mounting components in the liquid dielectric chamber on one surface of said plate.

3. A container according to claim 1 or 2 wherein the means for directing the flow of gas is an orifice formed in the metallic shell.

4. A heat dissipating metallic container for electrical components, comprising a hollow frame that is open at opposite ends; an isolation plate connected to the frame intermediate its ends to divide the frame into at least two interior chambers; a base plate member sealingly connected to one end of the frame enclosing one of the chambers; a cover assembly sealingly connected to the opposite end of the frame to enclose the other chamber, said cover assembly including a top member having one surface communicating with the interior of the container to form a cavity therein, a flexible bladder attached to the cover member covering the cavity and isolating it from the other chamber, said flexible bladder forming a portion of the other chamber; and means connecting the cavity to the one chamber.

5. A container according to claim 4 wherein said cover assembly further includes a rigid plate positioned to prevent flexing of the bladder into the other chamber.

6. A container according to claim 4 or 5 wherein the means connecting the cavity to the one chamber includes an orifice in the cover assembly in communication with an orifice in the frame.

7. A container according to claim 4 or 5 wherein the one chamber contains a liquid and the other chamber includes a gas.

8. A container according to claim 4 or 5 wherein the isolation plate has opposite surfaces, one of which forms part of the one chamber and the opposite of which forms part of the other chamber.

9. A container according to claim 4 or 5 wherein the base plate member includes means to attach components thereto for mounting on one surface thereof.

10. A container according to claim 4 or 5 wherein the isolation plate includes means for attaching components thereto for mounting in the other chamber.

11. A container according to claim 4 or 5 wherein the frame is substantially rectangular in configuration.

12. A container according to claim 11 wherein the opposite ends of the frame are flanged surfaces and the top member and base plate have flanged surfaces for sealing the chambers.

* * * * *